United States Patent
Lee et al.

(10) Patent No.: US 12,324,296 B2
(45) Date of Patent: Jun. 3, 2025

(54) INVERTED ORGANIC PHOTOVOLTAIC CELL AND METHOD OF MANUFACTURING SAME

(71) Applicant: GWANGJU INSTITUTE OF SCIENCE AND TECHNOLOGY, Gwangju (KR)

(72) Inventors: Kwang Hee Lee, Gwangju (KR); Hong Kyu Kang, Gwangju (KR); So Yeong Jeong, Gwangju (KR)

(73) Assignee: GWANGJU INSTITUTE OF SCIENCE AND TECHNOLOGY (KR)

( * ) Notice: Subject to any disclaimer, the term of this patent is extended or adjusted under 35 U.S.C. 154(b) by 0 days.

(21) Appl. No.: 18/264,418

(22) PCT Filed: Feb. 3, 2022

(86) PCT No.: PCT/KR2022/001679
§ 371 (c)(1),
(2) Date: Aug. 5, 2023

(87) PCT Pub. No.: WO2022/169259
PCT Pub. Date: Aug. 11, 2022

(65) Prior Publication Data
US 2024/0049485 A1    Feb. 8, 2024

(30) Foreign Application Priority Data
Feb. 5, 2021    (KR) .................. 10-2021-0016688

(51) Int. Cl.
*H10K 30/30*    (2023.01)
*H10K 30/50*    (2023.01)
(Continued)

(52) U.S. Cl.
CPC ............. *H10K 30/30* (2023.02); *H10K 30/50* (2023.02); *H10K 30/85* (2023.02); *H10K 85/215* (2023.02)

(58) Field of Classification Search
CPC ........ H10K 30/30; H10K 30/40; H10K 30/50; H10K 30/80; H10K 30/88; H10K 71/12; H10K 85/215
See application file for complete search history.

(56) References Cited

U.S. PATENT DOCUMENTS

2008/0264488 A1* 10/2008 Balasubramanian .. H10K 30/82
136/263
2015/0179965 A1*  6/2015 Lee ........................ H10K 30/30
438/82
(Continued)

FOREIGN PATENT DOCUMENTS

KR    20100011687 A    2/2010
KR    101130516 B1     3/2012
(Continued)

OTHER PUBLICATIONS

KR 10-1130516 B1 English Translation as provided by FIT database, translated on Sep. 11, 2024.*
(Continued)

*Primary Examiner* — Golam Mowla
(74) *Attorney, Agent, or Firm* — Renaissance IP Law Group LLP (57) ABSTRACT

The present inventive concept relates to an inverted organic solar cell and a method of manufacturing the same. Specifically, the inverted organic solar cell according to one embodiment of the present inventive concept includes a substrate; a lower electrode disposed on the substrate; an electron transport layer disposed on the lower electrode; a photoactive layer disposed on the electron transport layer and formed by mixing a photoactive material and an inner (Continued)

encapsulation material; a hole transport layer disposed on the photoactive layer; and an upper electrode disposed on the hole transport layer, wherein the inner encapsulation material has a carboxyl group, and at least a part of the inner encapsulation material may be self-assembled on the surface of the electron transport layer.

7 Claims, 11 Drawing Sheets

(51) Int. Cl.
    *H10K 30/85*     (2023.01)
    *H10K 85/20*     (2023.01)

(56) References Cited

U.S. PATENT DOCUMENTS

| | | | |
|---|---|---|---|
| 2016/0285024 A1* | 9/2016 | Carbonera | H10K 85/113 |
| 2019/0097144 A1* | 3/2019 | Huang | H10K 85/371 |
| 2022/0359824 A1* | 11/2022 | Ferrari | H10K 50/155 |
| 2023/0105166 A1* | 4/2023 | Sekimoto | H10K 85/625 |
| | | | 257/40 |

FOREIGN PATENT DOCUMENTS

| | | | |
|---|---|---|---|
| KR | 101458565 B1 | 11/2014 | |
| KR | 101488867 B1 | 2/2015 | |
| KR | 20150074704 A | 7/2015 | |
| KR | 20190131609 A | 11/2019 | |
| KR | 102167492 B1 | 10/2020 | |
| WO | 2018158884 A1 | 9/2018 | |
| WO | WO-2021261176 A1 * | 12/2021 | ......... H01L 51/0057 |

OTHER PUBLICATIONS

Gao, Xingyuan et al., "Anti-Coking Ni/SiO2 Catalyst for Dry Reforming of Methane: Role of Oleylamine/Oleic Acid Organic Pair", ChemCatChem, vol. 7, Issue 24, pp. 4188-4196, Dec. 14, 2015.

International Search Report for PCT/KR2022/001679 mailed May 12, 2022.

Ye, Guanghua et al., "Optimizing catalyst pore network structure in the presence of deactivation by coking", AIChE Journal, vol. 65, Issue 10, Oct. 2019.

* cited by examiner

INVERTED ORGANIC PHOTOVOLTAIC CELL AND METHOD OF MANUFACTURING SAME

TECHNICAL FIELD

The present inventive concept relates to an inverted organic solar cell and a method of manufacturing the same.

BACKGROUND ART

A solar cell is a semiconductor element that converts light energy into electrical energy, and is attracting attention as new renewable energy technology that can overcome recently emerging environmental problems and high oil prices.

Such solar cells are divided into inorganic solar cells using an inorganic material and organic solar cells using an organic material. Inorganic solar cells have the advantage of having high photoconversion efficiency, but have the disadvantage of limited commercialization due to high prices relative to their performance. On the other hand, since organic solar cells can be manufactured based on a solution process, the manufacturing process is simple compared to inorganic solar cells, so manufacturing costs can be reduced. Accordingly, organic solar cells are attracting attention as an alternative that can overcome the disadvantages of inorganic solar cells.

Specifically, an organic solar cell essentially includes a substrate, a lower electrode disposed on the substrate, an upper electrode disposed opposite to the lower electrode, and a photoactive layer disposed between the lower electrode and the upper electrode. Here, organic solar cells are divided into organic solar cells with a conventional structure and inverted organic solar cells according to a direction in which electrons and holes move. For example, an organic solar cell with a conventional structure has an anode electrode as a lower electrode and a cathode electrode as an upper electrode, whereas an inverted organic solar cell has a cathode electrode as a lower electrode, and an anode electrode as an upper electrode.

Meanwhile, the photoactive layer includes an electron donor and an electron acceptor, and generates excitons by light absorption. The excitons thus generated are separated into electrons and holes at a junction interface between an electron donor and an electron acceptor, and the separated electrons and holes move to a cathode electrode and an anode electrode, respectively. Here, to improve electron and hole movement/collection efficiency, functional layers (interlayers) may be included between the anode electrode and the photoactive layer, and between the cathode electrode and the photoactive layer, respectively.

Here, in the case of an organic solar cell with a conventional structure, as a lower electrode (anode electrode), a transparent electrode such as indium tin oxide (ITO) is used, as an upper electrode (cathode electrode), a metal with a low work function such as lithium (Li) or calcium (Ca) is used, and as a functional layer included between the lower electrode (anode electrode) and the photoactive layer, for example, a hole transport layer, poly(3,4-ethylenedioxythiophene) (PEDOT:PSS) is used. However, in this case, due to the low work function of the upper electrode (cathode electrode), the upper electrode (cathode electrode) may be oxidized, and since PEDOT:PSS forming the hole transport layer exhibits strong acidity, the lifetime of the element is degraded by the corrosion of the lower electrode (anode electrode) by the hole transport layer.

On the other hand, in the case of an inverted organic solar cell, as an upper electrode (anode electrode), since a metal with a high work function such as gold (Au) or silver (Ag) is used, the inverted organic solar cell is more stable than the organic solar cell with a conventional structure. However, in the inverted organic solar cell, since a metal oxide is used as a functional layer between a lower electrode (cathode electrode) and a photoactive layer, for example, an electron transport layer, radicals are generated in the electron transport layer due to a photocatalytic reaction caused by UV irradiation, and the generated radicals penetrate into the photoactive layer and the photoactive layer is damaged, thereby reducing photostability and degrading photoconversion efficiency.

To solve the above problems, a conventional inverted organic solar cell has a separate inner encapsulation layer introduced between an electron transport layer and a photoactive layer, such that the penetration of radicals generated in the electron transport layer into the photoactive layer is blocked by the inner encapsulation layer. However, in this case, since a process of forming the inner encapsulation layer between the electron transport layer and the photoactive layer is added, the manufacturing process becomes complicated, and manufacturing costs increase.

Accordingly, there is a need for research on an inverted organic solar cell with improved photostability and photoconversion efficiency, which has reduced manufacturing costs through a simplified manufacturing process.

DISCLOSURE

Technical Problems

Embodiments of the present inventive concept have been devised to address the above-described problems of the related art, and the present inventive concept is directed to providing an inverted organic solar cell with improved photostability and photoconversion efficiency, which has reduced manufacturing costs through a simplified manufacturing process, and a method of manufacturing the same.

Technical Solutions

According to one aspect, the present inventive concept may provide an inverted organic solar cell, which includes a substrate; a lower electrode disposed on the substrate; an electron transport layer disposed on the lower electrode; a photoactive layer disposed on the electron transport layer and formed by mixing a photoactive material and an inner encapsulation material; a hole transport layer disposed on the photoactive layer; and an upper electrode disposed on the hole transport layer, wherein the inner encapsulation material has a carboxyl group, and at least a part of the inner encapsulation material is self-assembled on the surface of the electron transport layer.

In addition, the inner encapsulation material may be at least one selected from the group consisting of 4-(1',5'-dihydro-1'-methyl-2'H-[5,6]fullereno-$C_{60}$-$I_h$-[1,9-c]pyrrol-2'-yl)benzoic acid (C60-SAM), tetra-n-butyl ammonium iodide (TBAI)-doped 2,3,4-tris(3-(propyl sulfobetaine)propoxy) fulleropyrrolidine (C60-SB), 3-aminopropanoic acid (C3-SAM), N-[3-(triethoxysilyl)propyl]-2-carbomethoxy-3,4-fulleropyrrolidine (Sil-C60), fullerene [6,6]-phenyl-C61-butyric acid 2-((2-(dimethylamino)ethyl)(methyl)amino)-ethyl ester (PCBDAN), benzoic acid, 4-aminobenzoic acid, 3-aminopropyltriethoxysilane, bromoacetic acid, phenylacetic acid, 4-phenylbutyric acid, 3-phenylpropionic acid, boronic acid, sinapoyl malate, 4-ammonium chloride, 3-aminopropyltriethoxysilane, 1,2-ethanedithiol, and 4-pyridinecarboxylic acid, but the present inventive concept is not limited thereto.

In addition, the electron transport layer may be at least one selected from the group consisting of zinc oxide (ZnO), titanium oxide (TiOx), tin oxide (SnO), and aluminum-doped zinc oxide (AZO), but the present inventive concept is not limited thereto.

In addition, the penetration of radicals generated from the electron transport layer into the photoactive layer may be prevented by the inner encapsulation material self-assembled on the surface of the electron transport layer.

In addition, the upper electrode may be at least one selected from the group consisting of metals, alloys, conductive polymers, other conductive compounds, and a combination thereof, but the present inventive concept is not limited thereto.

In addition, the hole transport layer may be at least one selected from the group consisting of molybdenum oxide ($MoO_3$), tungsten oxide ($WO_3$), and vanadium oxide ($V_2O_3$), but the present inventive concept is not limited thereto.

In addition, the lower electrode may be at least one selected from the group consisting of indium tin oxide (ITO), fluorinated tin oxide (PTO), indium zinc oxide (IZO), Al-doped zinc oxide (AZO), zinc oxide (ZnO), and indium zinc tin oxide (IZTO), but the present inventive concept is not limited thereto.

In addition, the substrate may be at least one selected from the group consisting of glass, quartz, polyethylene terephthalate (PET), polyethylene naphthalate (PEN), polyimide (PI), polycarbonate (PC), polystyrene (PS), polyoxyethylene (POM), an acrylonitrile-styrene copolymer (AS resin), and a triacetyl cellulose (TAC), but the present inventive concept is not limited thereto.

According to another aspect, the present inventive concept may provide a method of manufacturing an inverted organic solar cell, which includes: forming a lower electrode on a substrate; forming an electron transport layer on the lower electrode; forming a photoactive layer on the electron transport layer by mixing a photoactive material and an inner encapsulation material; forming a hole transport layer on the photoactive layer; and forming an upper electrode on the hole transport layer, wherein the forming of the photoactive layer includes forming a mixture by mixing the photoactive material and the inner encapsulation material with a solvent, and coating the electron transport layer with the mixture, and the inner encapsulation material has a carboxyl group, and at least a part of the inner encapsulation material is self-assembled on the surface of the electron transport layer.

In addition, the photoactive material and the inner encapsulation material may be mixed in a weight ratio of 100:1 or greater.

In addition, the mixture may be applied on the electron transport layer through at least one of spin coating, roll coating, spray coating, flow coating, inkjet printing, nozzle printing, dip coating, tape casting, screen printing, pad printing, doctor blade coating, slot-die coating, gravure printing, thermal transfer, and gravure offset printing.

Advantageous Effects

An inverted organic solar cell according to embodiments of the present inventive concept has an effect of having improved photostability and photoconversion efficiency.

In addition, a method of manufacturing an inverted organic solar cell according to embodiments of the present inventive concept has an effect of reducing manufacturing costs by simplifying a manufacturing process.

MODES OF THE INVENTION

Hereinafter, exemplary embodiments for implementing the spirit of the present inventive concept will be described in detail with reference to drawings.

Moreover, in the description of the present inventive concept, if it is determined that detailed description of the related art may obscure the gist of the present inventive concept, the detailed description thereof will be omitted.

The terms used herein are used only to describe specific embodiments, and not to limit the present inventive concept. Singular expressions include plural expressions unless the context clearly indicates otherwise.

In addition, terms including ordinal numbers, such as "first" and "second," may be used to describe various components, but the components should not be limited by these terms. The terms are used only to distinguish one component from another component.

The terms "include," "have," "including" or "having" used herein specify specific characteristics, regions, integers, steps, operations, elements and/or components, and it should be understood that the possibility of the presence or addition of other characteristics, regions, integers, steps, operations, elements, components and/or groups is not excluded in advance.

Hereinafter, with reference to the drawings, an inverted organic solar cell according to one embodiment of the present inventive concept will be described.

Figure 1:
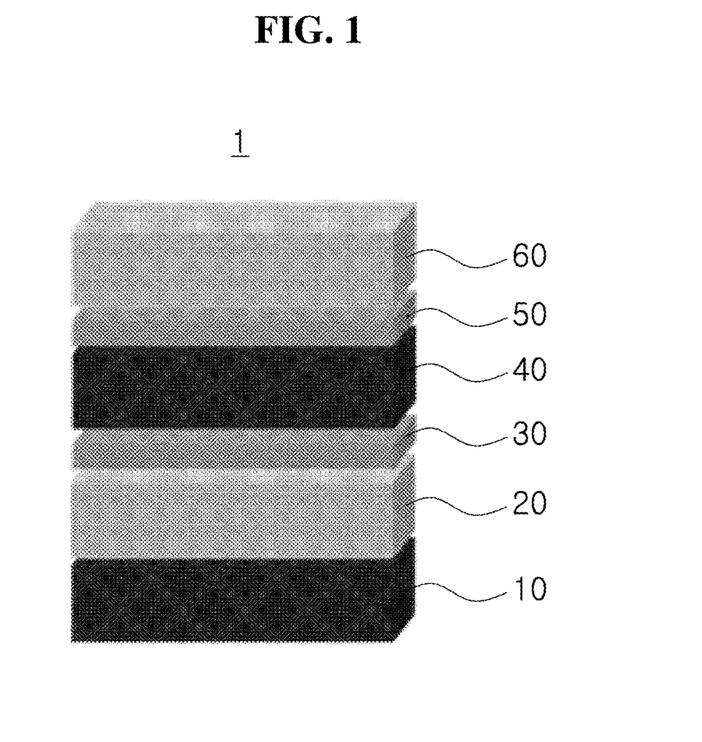
FIG. 1 is a diagram illustrating an inverted organic solar cell according to one embodiment of the present inventive concept.
Figure 2:
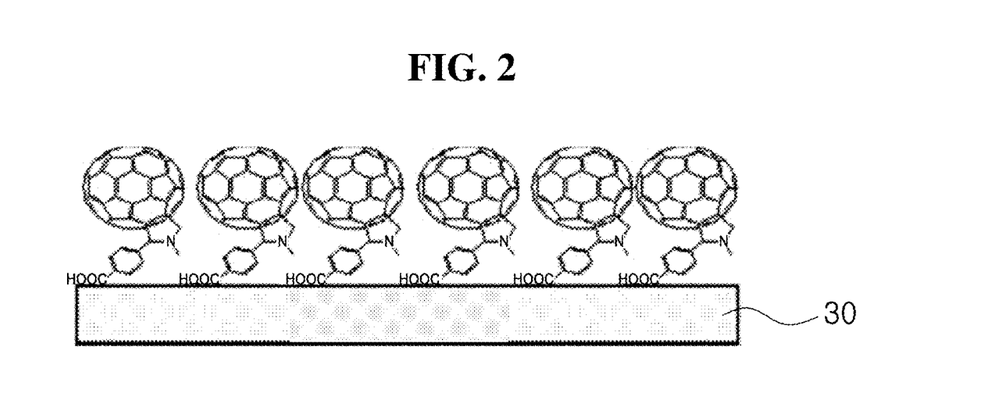
FIG. 2 is a schematic diagram illustrating an inner encapsulation material of a photoactive layer self-assembled on the surface of an electron transport layer in the inverted organic solar cell of FIG. 1.
Figure 3:
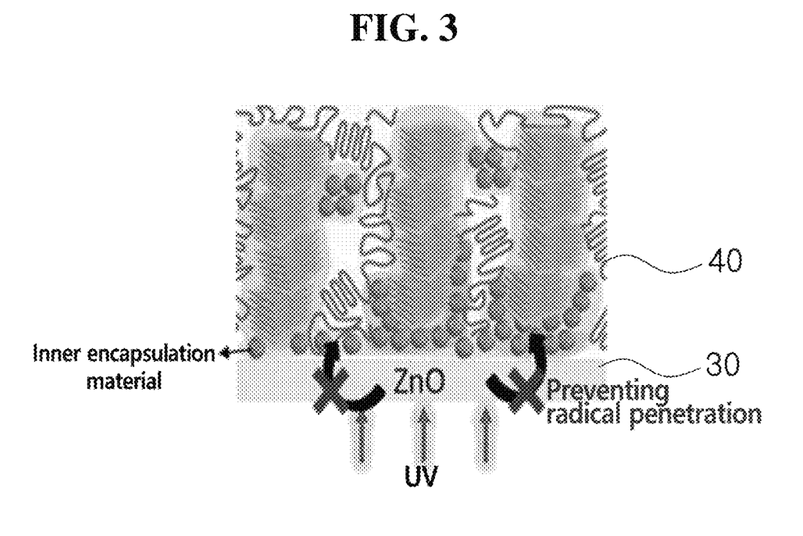
FIG. 3 is a schematic diagram illustrating a phenomenon in which radicals generated in an electron transport layer are blocked by an inner encapsulation material of a photoactive layer self-assembled on the surface of an electron transport layer in the inverted organic solar cell of FIG. 1.

Referring to FIGS. 1 to 3, an inverted organic solar cell 1 according to one embodiment of the present inventive concept may include a substrate 10, a lower electrode 20, an electron transport layer 30, a photoactive layer 40, a hole transport layer 50, and an upper electrode 60.

The substrate 10 may be formed of a material with light transmittance. For example, the substrate 10 may include at least one of glass, quartz, polyethylene terephthalate (PET), polyethylene naphthalate (PEN), polyimide (PI), polycarbonate (PC), polystyrene (PS), polyoxyethylene (POM), an acrylonitrile-styrene copolymer (AS resin), and triacetyl cellulose (TAC).

The lower electrode 20 may serve as a cathode electrode that receives electrons generated in the photoactive layer 40 and transfers the electrons to an external circuit. To this end, the lower electrode 20 may be disposed on the substrate 10. Here, the lower electrode may be formed of a material with light transmittance to allow light passing through the substrate 10 to reach the photoactive layer 40. For example, the lower electrode 20 may include at least one of indium tin oxide (ITO), fluorinated tin oxide (FTO), indium zinc oxide (IZO), Al-doped zinc oxide (AZO), zinc oxide (ZnO), and indium zinc tin oxide (IZTO).

The electron transport layer 30 may allow the electrons generated in the photoactive layer 40 to be easily transferred from the photoactive layer 40 to the lower electrode 20. To this end, the electron transport layer 30 may be disposed between the lower electrode 20 and the photoactive layer 40. For example, the electron transport layer 30 may be at least one selected from the group consisting of zinc oxide (ZnO), titanium oxide (TiOx), tin oxide (SnO), and aluminum-doped zinc oxide (AZO), but the present inventive concept is not limited thereto.

The photoactive layer 40 may generate excitons (electron-hole pairs) by light absorption. To this end, the photoactive layer 40 may include photoactive materials, for example, an electron donor and an electron acceptor. For example, the photoactive material may include at least one of D18:Y6, PTQ10:Y6, and PM6:Y6.

The excitons generated in the photoactive layer 40 may be separated into electrons and holes at a junction interface between the electron donor and the electron acceptor. The electrons separated in the photoactive layer 40 may move to the lower electrode 20 via the electron transport layer 30, and the holes separated in the photoactive layer 40 may move to the upper electrode 60 via the hole transport layer 50.

Meanwhile, the photoactive layer 40 may be formed by mixing a photoactive material and an inner encapsulation material. Here, the inner encapsulation material may include a carboxyl group. Here, at least a part of the inner encapsulation material may be self-assembled on the surface of the electron transport layer 30. Accordingly, the inner encapsulation material may passivate the photoactive layer 40 so the radicals generated in the electron transport layer 30 by UV radiation do not penetrate into the photoactive layer 40. For example, the inner encapsulation material may be at least one selected from the group consisting of 4-(1',5'-dihydro-1'-methyl-2'H-[5,6]fullereno-C60-Ih-[1,9-c]pyrrol-2'-yl)benzoic acid (C60-SAM), benzoic acid, 4-aminobenzoic acid, bromoacetic acid, phenylacetic acid, 4-phenylbutyric acid, 3-phenylpropionic acid, sinapoyl malate, and 4-pyridinecarboxylic acid, but the present inventive concept is not limited thereto.

The hole transport layer 50 may allow holes generated in the photoactive layer 40 to be easily transferred to the upper electrode 60 from the photoactive layer 40. To this end, the hole transport layer 50 may be disposed between the photoactive layer 40 and the upper electrode 60. For example, the hole transport layer 50 may include a conductive metal oxide such as molybdenum oxide ($MoO_3$), tungsten oxide ($WO_3$), and vanadium oxide ($V_2O_3$).

The upper electrode 60 may serve as an anode electrode that receives holes generated in the photoactive layer 40 and transfers the holes to an external circuit. To this end, the upper electrode 60 may be disposed on the hole transport layer 50. For example, the upper electrode may include at least one of metals, alloys, conductive polymers, other conductive compounds, and a combination thereof. The upper electrode 60 may be formed of a material with high oxidation stability against exposure to air, for example, a metal material with a high work function, such as gold (Au) or silver (Ag).

Hereinafter, an inverted organic solar cell according to one embodiment of the present inventive concept and a method of manufacturing the same will be described in further detail with reference to examples, comparative examples, and experimental examples of the present inventive concept. However, the following examples, comparative examples and experimental examples are merely provided to exemplify the present inventive concept, and the scope of the examples, comparative examples and experimental examples are not limited to the following examples, comparative examples and experimental examples.

Example 1

First, a substrate 10 was prepared, and a mixture for forming a photoactive layer 40 was prepared. To prepare the mixture, a photoactive material (D18:Y6) and an inner encapsulation material (C60-SAM) were mixed in chloroform in a weight ratio of 100:1 and stirred at 50° C. for 12 hours, thereby preparing the mixture.

Subsequently, indium tin oxide (ITO) was deposited on the prepared substrate 10 to form a lower electrode 20 with a thickness of 150 nm. Afterward, a zinc oxide (ZnO) solution was applied to coat the lower electrode 20 in a sol-gel method and dried at 200° C. for 20 minutes, thereby forming an electron transport layer 30 with a thickness of 30 nm.

The prepared mixture was then applied on the electron transport layer 30 by spin coating at 3,000 rpm, thereby forming a photoactive layer 40 with a thickness of 100 nm without drying.

Afterward, molybdenum oxide ($MoO_3$) was deposited on the photoactive layer 40 by thermal vacuum deposition under a vacuum atmosphere ($1 \times 10^{-7}$ torr), thereby forming a hole transport layer 50 having a thickness of 5 nm. Finally, an upper electrode 60 having a thickness of 150 nm was formed by thermal vacuum deposition of silver (Ag) on the hole transport layer 50, thereby obtaining an inverted organic solar cell.

Example 2

An inverted organic solar cell was manufactured in the same manner as Example 1, except that a photoactive layer 40 was formed using a photoactive material (PTQ10:Y6) and an inner encapsulation material (C60-SAM), instead of a photoactive material (D18:Y6) and an inner encapsulation material (C60-SAM).

Example 3

An inverted organic solar cell was manufactured in the same manner as Example 1, except that a photoactive layer 40 was formed using a photoactive material (PM6:Y6) and an inner encapsulation material (C60-SAM), instead of a photoactive material (D18:Y6) and an inner encapsulation material (C60-SAM).

Comparative Example 1

An inverted organic solar cell was manufactured in the same manner as Example 1, except that a photoactive layer 40 was formed using only a photoactive material (D18:Y6), instead of a photoactive material (D18:Y6) and an inner encapsulation material (C60-SAM).

Comparative Example 2

An inverted organic solar cell was manufactured in the same manner as Example 1, except that a photoactive layer 40 was formed using a photoactive material (PTQ10:Y6), instead of a photoactive material (D18:Y6) and an inner encapsulation material (C60-SAM).

Comparative Example 3

An inverted organic solar cell was manufactured in the same manner as Example 1, except that a photoactive layer 40 was formed using a photoactive material (PM6:Y6), instead of a photoactive material (D18:Y6) and an inner encapsulation material (C60-SAM).

Experimental Example 1—Evaluation of Element Performance of Inverted Organic Solar Cells According to Example 1 and Comparative Example 1 (I)

To confirm whether the manufacture of the photoactive layer 40 by mixing the inner encapsulation material (C60-SAM) with the photoactive material (D18:Y6) affected the element performance of an inverted organic solar cell, the element performance of the inverted organic solar cell manufactured in Example 1 was compared with that of Comparative Example 1.

Figure 4:
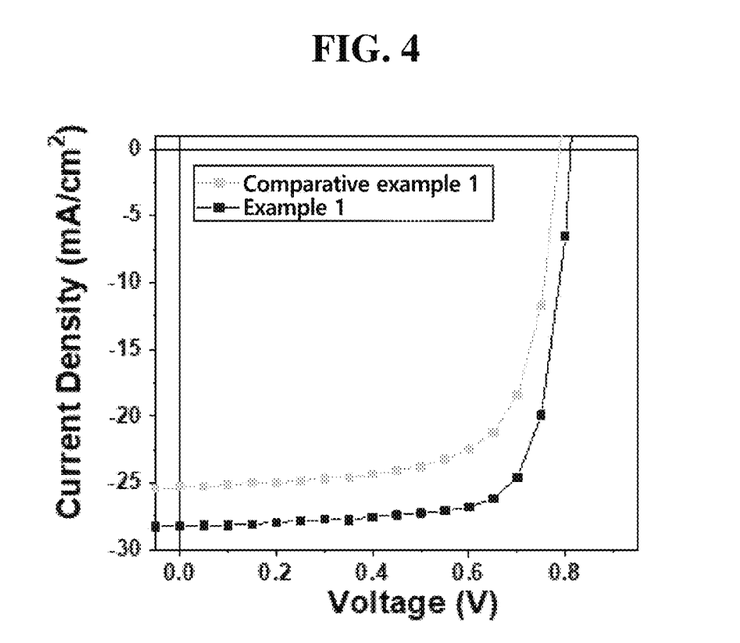
FIG. 4 is a graph showing the current density-voltage (J-V) characteristics for inverted organic solar cells according to Example 1 and Comparative Example 1.

Specifically, the open-circuit voltage ($V_{oc}$), short-circuit current density ($J_{sc}$), fill factor (FF), and photoconversion efficiency (PCE) of each of the inverted organic solar cell manufactured in Example 1 and the inverted organic solar cell manufactured in Comparative Example 1 were measured, and the measured values are shown in FIG. 4 and Table 1.

TABLE 1

| | RPM | Open-circuit voltage ($V_{oc}$) (V) | Short-circuit current density ($J_{sc}$) (mA/cm$^2$) | Fill factor (FF) | Photo-conversion efficiency (PCE) (%) |
|---|---|---|---|---|---|
| Example 1 | 3500 | 0.82 | 29.2 (24.50) | 0.75 | 18.02 (15.11) |
| Comparative Example 1 | 3000 | 0.82 | 23.96 (21.55) | 0.75 | 14.76 (13.27) |

As shown in FIG. 4 and Table 1, it was confirmed that Example 1 including the photoactive layer 40 formed of the photoactive material (D18:Y6) and the inner encapsulation material (C60-SAM) has improved short-circuit current density ($J_{sc}$) and photoconversion efficiency, compared to Comparative Example 1 including the photoactive layer 40 formed of the photoactive material (D18:Y6). This can be seen as meaning that electron transport is facilitated by the inner encapsulation material (C60-SAM), thereby improving element performance.

Experimental Example 2—Evaluation of Element Performance of Inverted Organic Solar Cells According to Example 1 and Comparative Example 1 (II)

To confirm whether the manufacture of the photoactive layer 40 by mixing the inner encapsulation material (C60-SAM) with the photoactive material (D18:Y6) affected the element performance of an inverted organic solar cell, the element performance of the inverted organic solar cell manufactured in Example 1 was compared with that of Comparative Example 1.

Figure 5:
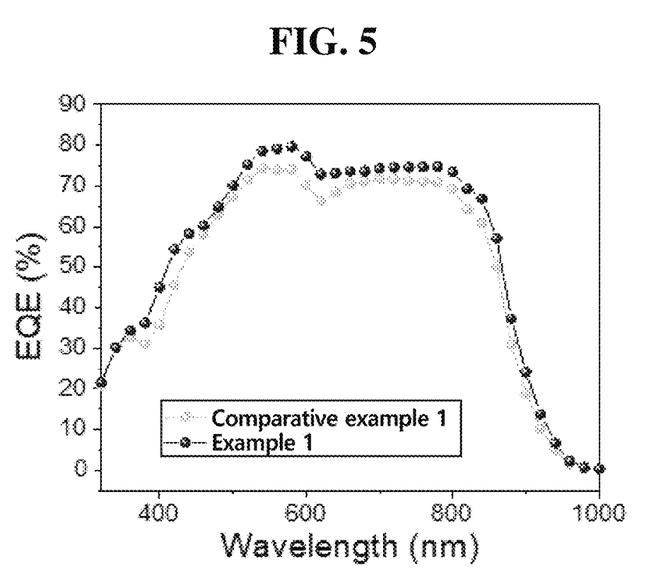
FIG. 5 is a graph obtained by measuring external quantum efficiency (EQE) for inverted organic solar cells according to Example 1 and Comparative Example 1.
Figure 6:
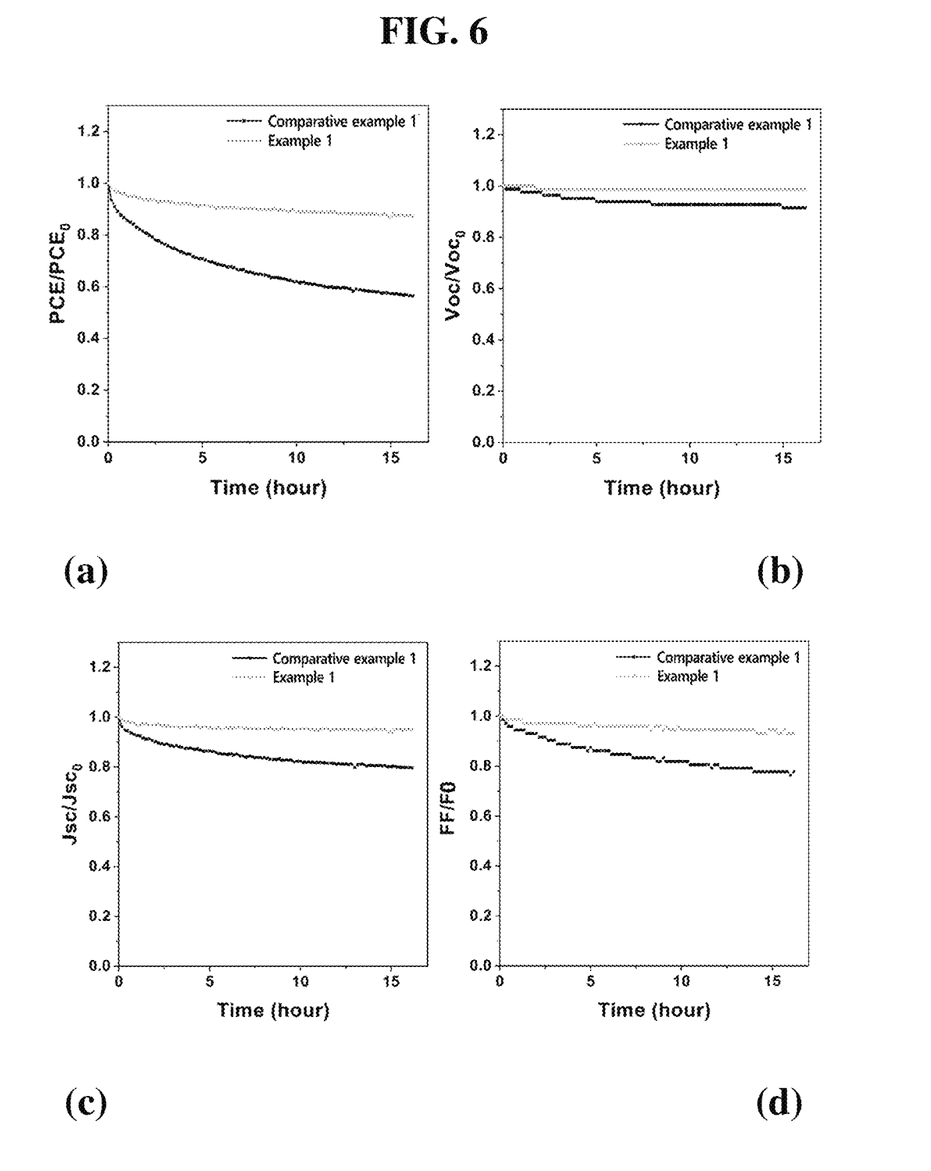
FIGS. 6a-6d are a set of graphs obtained by measuring changes in photoconversion efficiency (PCE), open-circuit voltage ($V_{oc}$), short-circuit current density ($J_{sc}$), and fill factor (FF) over time for inverted organic solar cells according to Example 1 and Comparative Example 1.

Specifically, the external quantum efficiency (EQE) of each of the inverted organic solar cell manufactured in Example and the inverted organic solar cell manufactured in Comparative Example 1 was measured, and the measured values are shown in FIG. 5.

As shown in FIG. 5, it was confirmed that Example 1 has a higher external quantum efficiency (EQE) throughout the entire range of wavelengths, compared to Comparative Example 1. This can be seen as meaning that electron transport is facilitated by the inner encapsulation material (C60-SAM), thereby improving element performance.

Experimental Example 3—Evaluation of Photostability of Inverted Organic Solar Cells According to Example 1 and Comparative Example 1

To confirm whether the manufacture of the photoactive layer 40 by mixing the inner encapsulation material (C60-SAM) with the photoactive material (D18:Y6) affected the photostability of an inverted organic solar cell, the photostability of the inverted organic solar cell in Example 1 was compared with that of Comparative Example 1.

Specifically, each of the inverted organic solar cell manufactured in Example 1 and the inverted organic solar cell manufactured in Comparative Example 1 was exposed to sunlight of AM 1.5G and 100 mW/cm² intensity for 15 hours, and changes in photoconversion efficiency (PCE), open-circuit voltage ($V_{oc}$), short-circuit current density ($J_{sc}$), and fill factor (FF) over time were measured. The measured results are shown in FIGS. 6A to 6D.

As shown in FIGS. 6A to 6D, it was confirmed that Example 1 including the photoactive layer 40 formed of the photoactive material (D18:Y6) and the inner encapsulation material (C60-SAM) has a photoconversion efficiency improved by 30%, compared to Comparative Example 1 including the photoactive layer 40 formed of the photoactive material (D18:Y6). In addition, it was confirmed that, in the case of Example 1, the efficiency is maintained at 87% of the initial photoconversion efficiency. This can be seen as meaning that the penetration of radicals of the electron transport layer 30 into the photoactive layer 40 is prevented by the inner encapsulation material (C60-SAM), thereby improving the photostability of the element.

Experimental Example 4—Analytical Evaluation of Photoactive Layers of Inverted Organic Solar Cells According to Example 1 and Comparative Example 1

Figure 7:
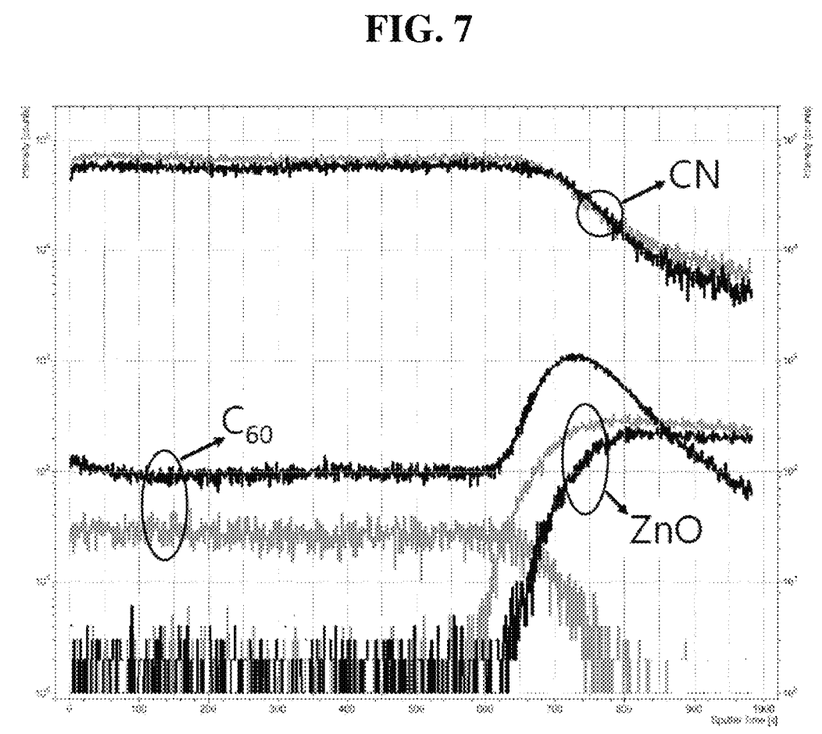
FIG. 7 is a graph showing the results of ToF-SIMS analysis for inverted organic solar cells according to Example 1 and Comparative Example 1.

The photoactive layer of each of the inverted organic solar cells manufactured in Example 1 and Comparative Example 1 was analyzed using time-of-flight secondary ion mass spectrometry (ToF-SIMS), and the analysis results are shown in FIG. 7.

Referring to FIG. 7, as a result of tracking the signal of C60 inherent in the inner encapsulation material, it was able to be seen that the signal intensity of C60 of Example 1 is generally higher than that of Comparative Example 1. Particularly, it was confirmed that the signal intensity of C60 greatly increases near the electron transport layer 30, e.g., ZnO. From the above result, it was confirmed that the inner encapsulation material is mainly formed on the surface of the electron transport layer 30, and mixed with a photoactive material in the photoactive layer 40.

Experimental Example 5—Evaluation of Element Performance of Inverted Organic Solar Cells According to Example 2 and Comparative Example 2 (I)

To confirm whether the manufacture of the photoactive layer 40 by mixing the inner encapsulation material (C60-SAM) with the photoactive material (PTQ10:Y6) affected the element performance of an inverted organic solar cell, the element performance of the inverted organic solar cell manufactured in Example 2 was compared with that of Comparative Example 2.

Figure 8:
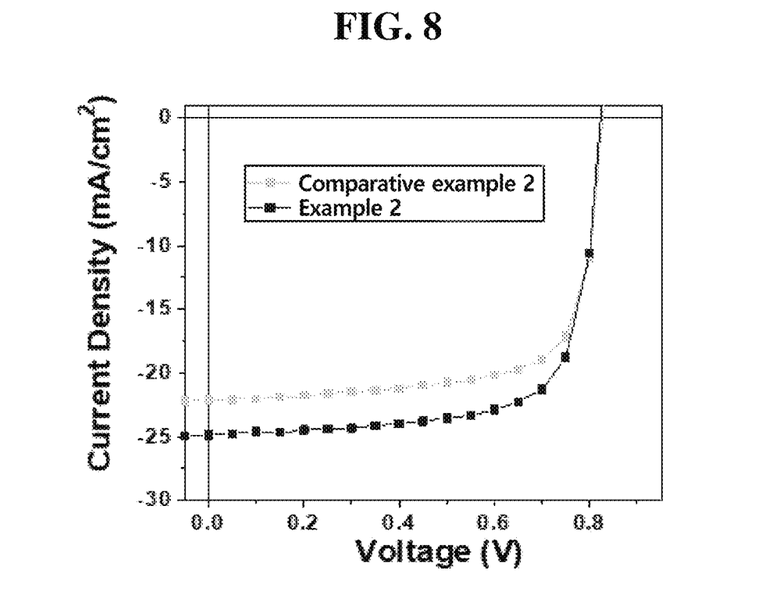
FIG. 8 is a graph showing current density-voltage (J-V) characteristics for inverted organic solar cells according to Example 2 and Comparative Example 2.

Specifically, the open-circuit voltage ($V_{oc}$), short-circuit current density ($J_{sc}$), fill factor (FF), and photoconversion efficiency (PCE) of each of the inverted organic solar cell manufactured in Example 2 and the inverted organic solar cell manufactured in Comparative Example 2 were measured, and the measured values are shown in FIG. 8 and Table 2 below.

TABLE 2

|  | RPM | Open-circuit voltage ($V_{oc}$) (V) | Short-circuit current density ($J_{sc}$) (mA/cm²) | Fill factor (FF) | Photo-conversion efficiency (PCE) (%) |
| --- | --- | --- | --- | --- | --- |
| Example 2 | 1500 | 0.82 | 24.85 (23.65) | 0.73 | 14.89 (14.17) |
| Comparative Example 2 | 2500 | 0.83 | 22.05 (21.18) | 0.73 | 13.23 (12.70) |

Referring to FIG. 8 and Table 2, Example 2 including the photoactive layer 40 formed of the photoactive material (PTQ10:Y6) and the inner encapsulation material (C60-SAM) has improved short-circuit current density ($J_{sc}$) and photoconversion efficiency, compared to Comparative Example 2 including the photoactive layer 40 formed of the photoactive material (PTQ10:Y6). This can be seen as meaning that electron transport is facilitated by the inner encapsulation material (C60-SAM), thereby improving the performance of the element.

Experimental Example 6—Evaluation of Element Performance of Inverted Organic Solar Cells According to Example 2 and Comparative Example 2 (II)

To confirm whether the manufacture of the photoactive layer 40 by mixing the inner encapsulation material (C60-SAM) with the photoactive material (PTQ10:Y6) affected the element performance of an inverted organic solar cell, the element performance of the inverted organic solar cell manufactured in Example 2 was compared with that of Comparative Example 2.

Figure 9:
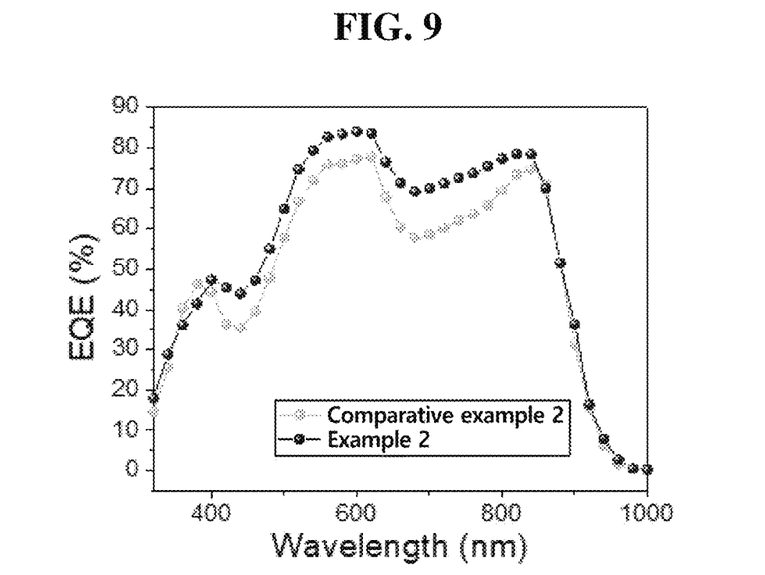
FIG. 9 is a graph obtained by measuring external quantum efficiency (EQE) for inverted organic solar cells according to Example 2 and Comparative Example 2.
Figure 10:
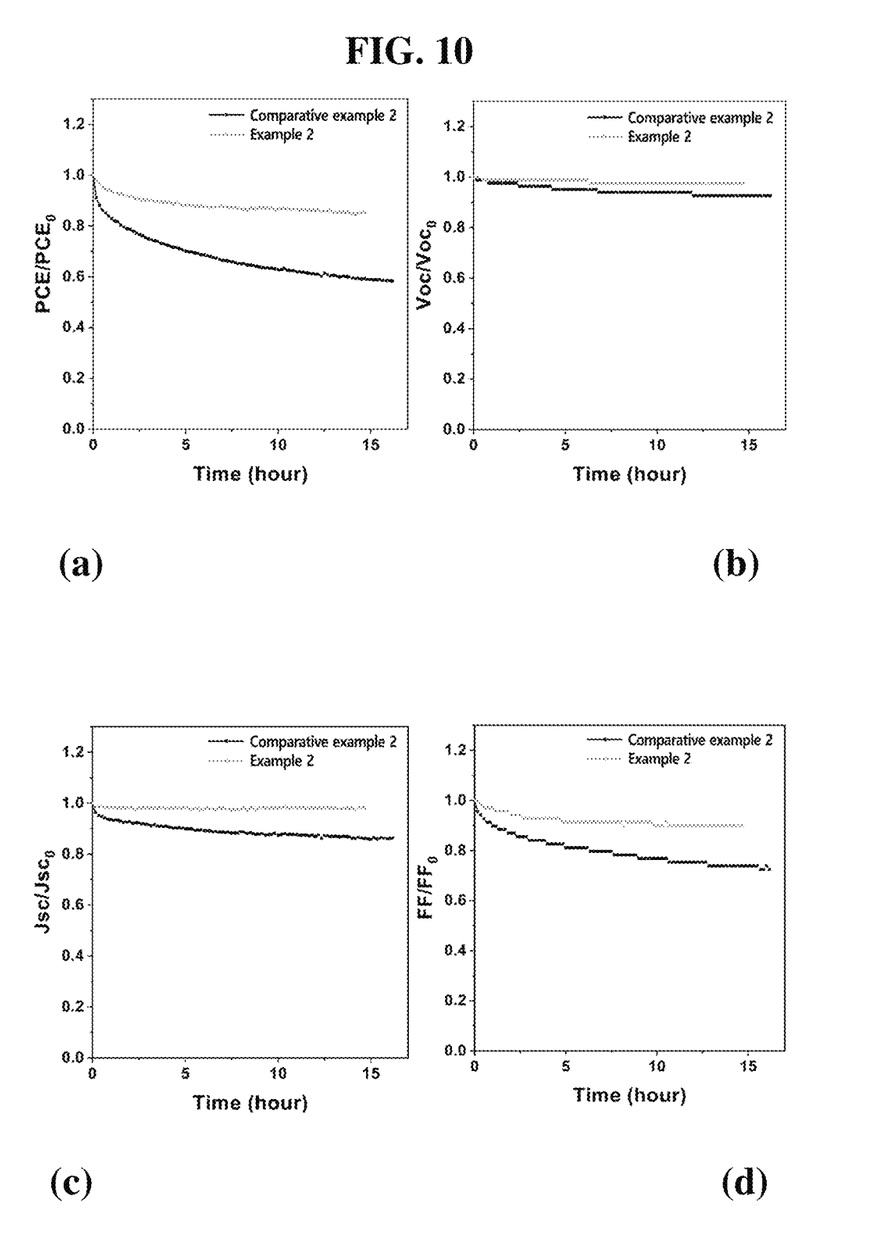
FIGS. 10a-10d are a set of graphs obtained by measuring changes in photoconversion efficiency (PCE), open-circuit voltage ($V_{oc}$), short-circuit current density ($J_{sc}$), and fill factor (FF) over time for inverted organic solar cells according to Example 2 and Comparative Example 2.

Specifically, the external quantum efficiency (EQE) of each of the inverted organic solar cell manufactured in Example 2 and the inverted organic solar cell manufactured in Comparative Example 2 was measured, and the measured values are shown in FIG. 9.

As shown in FIG. 9, it was confirmed that Example 2 has higher external quantum efficiency (EQE) than Comparative Example 2 at wavelengths in the range of 400 nm to 800 nm. This can be seen as meaning that electron transport is facilitated by the inner encapsulation material (C60-SAM), thereby improving element performance.

Experimental Example 7—Evaluation of Photostability of Inverted Organic Solar Cells According to Example 2 and Comparative Example 2

To confirm whether the manufacture of the photoactive layer 40 by mixing the inner encapsulation material (C60-SAM) with the photoactive material (PTQ10:Y6) affected the photostability of an inverted organic solar cell, the photostability of the inverted organic solar cell manufactured in Example 2 was compared with that of Comparative Example 2.

Specifically, each of the inverted organic solar cell manufactured in Example 2 and the inverted organic solar cell manufactured in Comparative Example 2 was exposed to sunlight of AM 1.5G and 100 mW/cm² intensity for 14 hours, and changes in photoconversion efficiency (PCE), open-circuit voltage ($V_{oc}$), short-circuit current density ($J_{sc}$), and fill factor (FF) over time were measured. The measured results are shown in FIGS. 10A to 10D.

Referring to FIGS. 10A to 10D, it was confirmed that Example 2 including the photoactive layer 40 formed of the photoactive material (PTQ10:Y6) and the inner encapsulation material (C60-SAM) has a photoconversion efficiency improved by 25%, compared to Comparative Example 2 including the photoactive layer 40 formed of the photoactive material (PTQ10:Y6). In the case of Example 2, it was confirmed that the efficiency is maintained at 85% of the initial photoconversion efficiency. This can be seen as meaning that the penetration of radicals of the electron transport layer 30 into the photoactive layer 40 is prevented by the inner encapsulation material (C60-SAM), thereby improving the photostability of the element.

Experimental Example 8—Analytical Evaluation of Photoactive Layers of Inverted Organic Solar Cells According to Example 2 and Comparative Example 2

Figure 11:
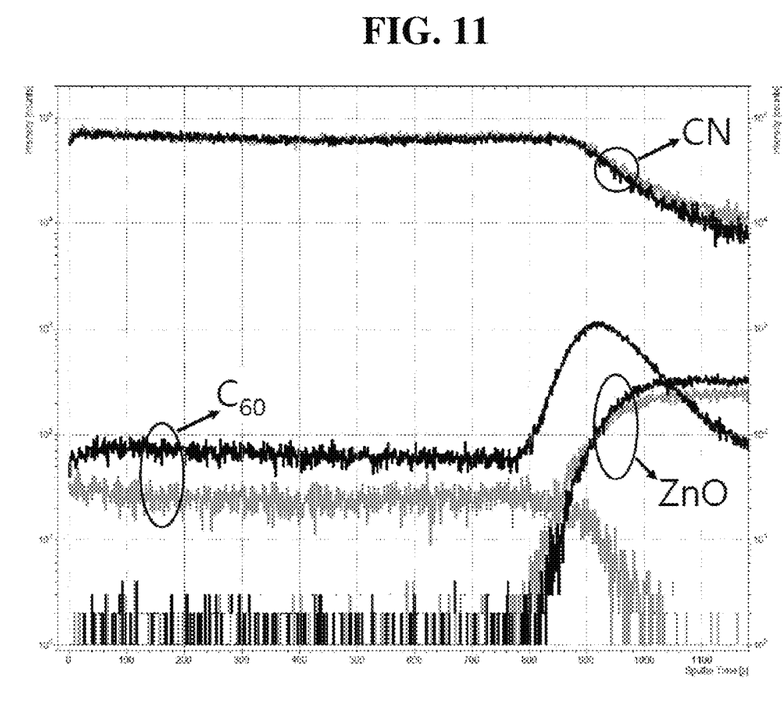
FIG. 11 is a graph showing the results of ToF-SIMS analysis for inverted organic solar cells according to Example 2 and Comparative Example 2.

Each of the photoactive layers of the inverted organic cells manufactured in Example 2 and Comparative Example 2 was analyzed using time-of-flight secondary ion mass spectrometry (ToF-SIMS), and the analysis results are shown in FIG. 11.

As shown in FIG. 11, as a result of tracking the signal of C60 inherent in the inner encapsulation material, it was confirmed that, compared to Comparative Example 2, the signal intensity of C60 of Example 2 is generally higher, and particularly, the signal intensity of C60 greatly increases near the electron transport layer 30, e.g., ZnO. From the above result, it was confirmed that the inner encapsulation material is mainly formed on the surface of the electron transport layer 30, and mixed with a photoactive material in the photoactive layer 40.

Experimental Example 9—Evaluation of Element Performance of Inverted Organic Solar Cells According to Example 3 and Comparative Example 3

To confirm whether the manufacture of the photoactive layer 40 by mixing the inner encapsulation material (C60-SAM) with the photoactive material (PM6:Y6) affected the element performance of an inverted organic solar cell, the element performance of the inverted organic solar cell manufactured in Example 3 was compared with that of Comparative Example 3.

Figure 12:
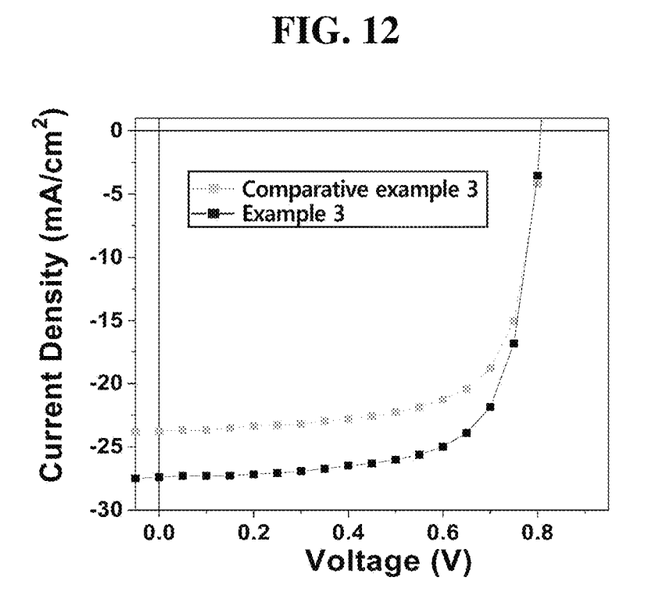
FIG. 12 is a graph showing current density-voltage (J-V) characteristics for inverted organic solar cells according to Example 3 and Comparative Example 3.
Figure 13:
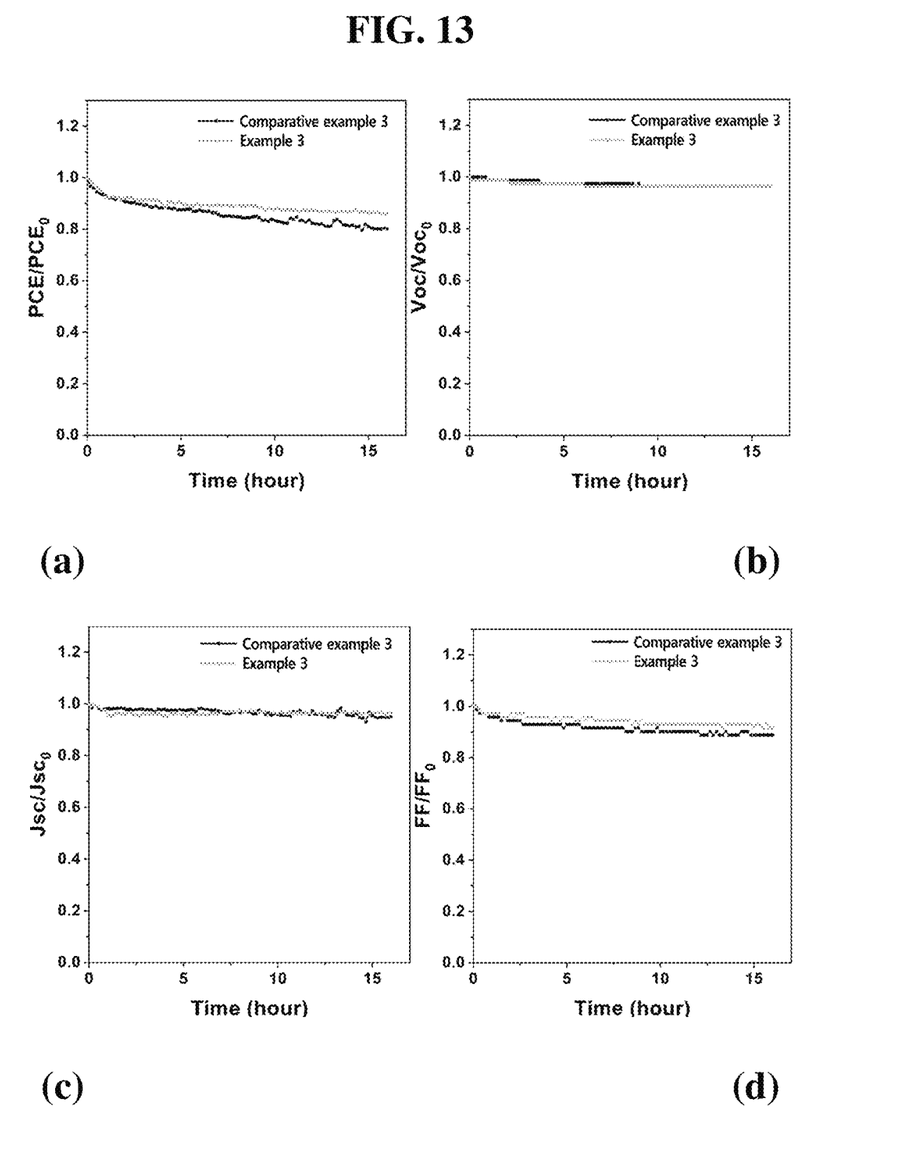
FIGS. 13a-13d are a set of graphs obtained by measuring changes in photoconversion efficiency (PCE), open-circuit voltage ($V_{oc}$), short-circuit current density ($J_{sc}$), and fill factor (FF) over time for inverted organic solar cells according to Example 3 and Comparative Example 3.

Specifically, the open-circuit voltage ($V_{oc}$), short-circuit current density ($J_{sc}$), fill factor (FF), and photoconversion efficiency (PCE) of each of the inverted organic solar cell manufactured in Example 3 and the inverted organic solar cell manufactured in Comparative Example 3 were measured, and the measured values are shown in FIG. 12 and Table 3 below.

TABLE 3

|  | RPM | Open-circuit voltage ($V_{oc}$) (V) | Short-circuit current density ($J_{sc}$) (mA/cm²) | Fill factor (FF) | Photo-conversion efficiency (PCE) (%) |
|---|---|---|---|---|---|
| Example 3 | 2500 | 0.81 | 27.39 | 0.7 | 15.54 |
| Comparative Example 3 | 2700 | 0.81 | 23.76 | 0.69 | 13.28 |

Referring to FIG. 2 and Table 3, it was confirmed that Example 3 including the photoactive layer 40 formed of the photoactive material (PM6:Y6) and the inner encapsulation material (C60-SAM) has improved short-circuit current density ($J_{sc}$) and photoconversion efficiency, compared to Comparative Example 3 including the photoactive layer 40 formed of the photoactive material (PM6:Y6). This can be seen as meaning that electron transport is facilitated by the inner encapsulation material (C60-SAM), thereby improving element performance.

Experimental Example 8—Evaluation of Photostability of Inverted Organic Solar Cells According to Example 3 and Comparative Example 3

To confirm whether the manufacture of the photoactive layer 40 by mixing the inner encapsulation material (C60-SAM) with the photoactive material (PM6:Y6) affected the photostability of an inverted organic solar cell, the photostability of the inverted organic solar cell manufactured in Example 3 was compared with that of Comparative Example 3.

Specifically, each of the inverted organic solar cell manufactured in Example 3 and the inverted organic solar cell manufactured in Comparative Example 3 was exposed to sunlight of AM 1.5 G and 100 mW/cm² intensity for 14 hours, and changes in photoconversion efficiency (PCE), open-circuit voltage ($V_{oc}$), short-circuit current density ($J_{sc}$), and fill factor (FF) over time were measured. The measured results are shown in FIGS. 13A to 13D.

As shown in FIGS. 13A to 13D, it was confirmed that Example 3 including the photoactive layer 40 formed of the photoactive material (PM6:Y6) and the inner encapsulation material (C60-SAM) has a photoconversion efficiency increased by 6%, compared to Comparative Example 3 including the photoactive layer 40 formed of the photoactive material (PM6:Y6). In the case of Example 2, it was confirmed that the efficiency is maintained at 86% of the initial photoconversion efficiency. This can be seen as meaning that the penetration of radicals of the electron transport layer 30 into the photoactive layer 40 is prevented by the inner encapsulation material (C60-SAM), thereby improving the photostability of the element.

Experimental Example 9—Analytical Evaluation of Photoactive Layers of Inverted Organic Solar Cells According to Example 3 and Comparative Example 3

Figure 14:
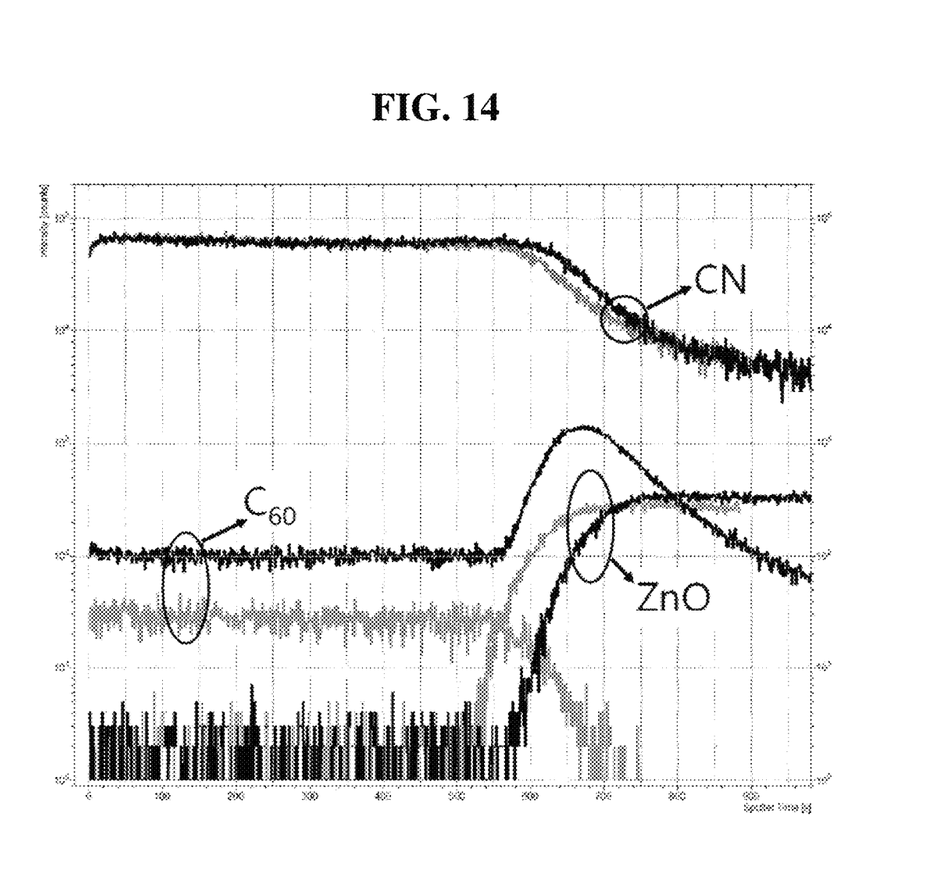
FIG. 14 is a graph showing the results of ToF-SIMS analysis for inverted organic solar cells according to Example 3 and Comparative Example 3.

The photoactive layer of each of the inverted organic solar cells manufactured in Example 3 and Comparative Example 3 was analyzed using time-of-flight secondary ion mass spectrometry (ToF-SIMS), and the analysis results are shown in FIG. 14.

As shown in FIG. 14, as a result of tracking the signal of C60 inherent in the inner encapsulation material, it was confirmed that, compared to Comparative Example 3, the signal intensity of C60 of Example 3 is generally higher, and particularly, the signal intensity of C60 greatly increases near the electron transport layer 30, e.g., ZnO. From the above result, it was confirmed that the inner encapsulation material is mainly formed on the surface of the electron transport layer 30, and mixed with a photoactive material in the photoactive layer 40.

The present inventive concept may have various modifications and various examples, and thus specific examples are illustrated in the drawings and described in detail in the detailed description. However, it should be understood that the present inventive concept is not limited to specific embodiments, and includes all modifications, equivalents or alternatives within the spirit and technical scope of the present inventive concept. Like numerals have been used to denote like elements to describe each drawing.

All terms including technical and scientific terms have the same meaning that is generally understood by those skilled in the art unless defined otherwise. General terms, such as terms defined in dictionaries, should be interpreted with meanings according to the context of the related art, and should not be interpreted with ideal or excessively formal meanings unless clearly defined herein.

The invention claimed is:

1. An inverted organic solar cell, comprising:
a substrate;
a lower electrode disposed on the substrate;
an electron transport layer disposed on the lower electrode;
a photoactive layer disposed on the electron transport layer and formed by mixing a photoactive material and an inner encapsulation material;
a hole transport layer disposed on the photoactive layer; and
an upper electrode disposed on the hole transport layer,
wherein the inner encapsulation material has a carboxyl group and at least a part of the inner encapsulation material is self-assembled on the surface of the electron transport layer,
wherein the inner encapsulation material is at least one selected from the group consisting of 4-(1',5'-dihydro-1'-methyl-2'H-[5,6]fullereno-C60-Ih-[1,9-c]pyrrol-2'-yl)benzoic acid (C60-SAM), 3-aminopropanoic acid (C3-SAM), benzoic acid, 4-aminobenzoic acid, bromoacetic acid, phenylacetic acid, 4-phenylbutyric acid, 3-phenylpropionic acid, sinapoyl malate, and 4-pyridinecarboxylic acid,
wherein the inner encapsulation material facilitates electron transport inside the photoactive layer as the photoactive material and the inner encapsulation material are mixed in inner region of the photoactive layer and the inner encapsulation material has uniform concentration in the inner region of the photoactive layer, the inner encapsulation material is formed at a higher concentration on the surface of the electron transport layer than the inner region of the photoactive layer.

2. The inverted organic solar cell of claim 1, wherein the electron transport layer is at least one selected from the group consisting of zinc oxide (ZnO), titanium oxide (TiOx), tin oxide (SnO), and aluminum-doped zinc oxide (AZO).

3. The inverted organic solar cell of claim 2, wherein the penetration of radicals generated from the electron transport layer into the photoactive layer is prevented by the inner encapsulation material self-assembled on the surface of the electron transport layer.

4. The inverted organic solar cell of claim 1, wherein the upper electrode is at least one selected from the group consisting of metals, alloys, conductive polymers, other conductive compounds, and a combination thereof.

5. The inverted organic solar cell of claim 1, wherein the hole transport layer is at least one selected from the group consisting of molybdenum oxide (MoO3), tungsten oxide (WO3), and vanadium oxide (V2O3).

6. The inverted organic solar cell of claim 1, wherein the lower electrode is at least one selected from the group consisting of indium tin oxide (ITO), fluorinated tin oxide (FTO), indium zinc oxide (IZO), Al-doped zinc oxide (AZO), zinc oxide (ZnO), and indium zinc tin oxide (IZTO).

7. The inverted organic solar cell of claim 1, wherein the substrate is at least one selected from the group consisting of glass, quartz, polyethylene terephthalate (PET), polyethylene naphthalate (PEN), polyimide (PI), polycarbonate (PC), polystyrene (PS), polyoxyethylene (POM), an acrylonitrile-styrene copolymer (AS resin), and triacetyl cellulose (TAC).

\* \* \* \* \*